US009439300B2

(12) United States Patent
Tanida

(10) Patent No.: US 9,439,300 B2
(45) Date of Patent: Sep. 6, 2016

(54) MOUNTING METHOD OF ELECTRONIC COMPONENT AND ELECTRONIC COMPONENT MOUNT BODY

(71) Applicant: Yuichi Tanida, Takarazuka (JP)

(72) Inventor: Yuichi Tanida, Takarazuka (JP)

(73) Assignee: RICOH COMPANY, LTD., Tokyo (JP)

( * ) Notice: Subject to any disclaimer, the term of this patent is extended or adjusted under 35 U.S.C. 154(b) by 246 days.

(21) Appl. No.: 14/157,779

(22) Filed: Jan. 17, 2014

(65) Prior Publication Data

US 2014/0218881 A1 Aug. 7, 2014

(30) Foreign Application Priority Data

Feb. 5, 2013 (JP) ................................ 2013-020842

(51) Int. Cl.

*H05K 3/34* (2006.01)
*H05K 3/30* (2006.01)
*H01L 23/00* (2006.01)

(52) U.S. Cl.

CPC ............ *H05K 3/3436* (2013.01); *H01L 24/81* (2013.01); *H05K 3/303* (2013.01); *H01L 24/13* (2013.01); *H01L 24/16* (2013.01); *H01L 2224/1134* (2013.01); *H01L 2224/1184* (2013.01); *H01L 2224/131* (2013.01); *H01L 2224/13147* (2013.01); *H01L 2224/14155* (2013.01); *H01L 2224/16105* (2013.01); *H01L 2224/16225* (2013.01); *H01L 2224/16227* (2013.01); *H01L 2224/81193* (2013.01); *H01L 2224/81194* (2013.01); *H05K 2201/10674* (2013.01); *H05K 2203/048* (2013.01); *H05K 2203/166* (2013.01); *Y02P 70/613* (2015.11)

(58) Field of Classification Search

CPC ............ H05K 1/0284; H05K 3/0011; H05K 3/0014; H05K 3/303; H05K 3/3436; H05K 2201/10674; H05K 2203/048; H05K 2203/166; H01L 24/13; H01L 24/16; H01L 24/81; H01L 2224/131; H01L 2224/1134; H01L 2224/1184; H01L 2224/13147; H01L 2224/14156; H01L 2224/16105; H01L 2224/81193; H01L 2224/81194; H01L 2924/00014; H01L 2924/014; Y02P 70/613

See application file for complete search history.

(56) References Cited

U.S. PATENT DOCUMENTS

2006/0094157 A1 5/2006 Kobae et al.
2007/0015311 A1 1/2007 Kobae et al.
2008/0061435 A1 3/2008 Kobae et al.

FOREIGN PATENT DOCUMENTS

CN 100433305 C * 11/2008
JP 2004-297003 10/2004
JP 2006-128484 5/2006
JP 2009-161726 7/2009

* cited by examiner

*Primary Examiner* — Carl Arbes
(74) *Attorney, Agent, or Firm* — Cooper & Dunham LLP

(57) ABSTRACT

An electronic component is provided with two or more component terminals. A mount board is provided with two or more board terminals. The board terminal is provided with an inclined portion on a surface of the board terminal, the inclined portion being the wider as closer to a base end side toward a peripheral edge. A position of the component terminal is offset in relation to a position of the corresponding board terminal. A position of the other component terminal is offset in the opposite side to the direction of the offset in relation to a position of the corresponding board terminal. The component terminal makes contact with the inclined portion of the board terminal to bond the component terminal and the board terminal.

10 Claims, 6 Drawing Sheets

MOUNTING METHOD OF ELECTRONIC COMPONENT AND ELECTRONIC COMPONENT MOUNT BODY

CROSS-REFERENCE TO RELATED APPLICATION

This application claims priority from Japanese Patent Application No. 2013-020842 filed on Feb. 5, 2013, the disclosure of which is herein incorporated by reference.

BACKGROUND OF THE INVENTION

1. Field of the Invention

The present invention relates to a mounting method of an electronic component, an electronic component mount body and a manufacturing method thereof, and particularly, to a mounting method of an electronic component, an electronic component mount body and a manufacturing method thereof, wherein the electronic component is mounted on a mount board by flip-chip bonding.

2. Description of the Related Art

In semiconductor mount fields, at the time an electronic component is mounted on a mount board, electrical connection between a component terminal of the electrical component and a board terminal of the mount board is generally performed by a wire bonding system or a flip-chip system. The electronic component is, for example, an integrated circuit (IC). Examples of the mount board include a lead terminal of a semiconductor package represented by a quad flat package (QFP), a chip size package (CSP) or the like, or a print board represented by a chip on board (COB) or the like.

In the flip-chip system, each of the component terminal and the board terminal has a material and a shape suitable for the electrical bond. At the time the electronic component is mounted on the mount board by the flip-chip system, after positional alignment of the component terminal and the board terminal is performed, pressures, vibrations, heat or the like is applied thereto. Thereby the component terminal and the board terminal are electrically bonded (for example, see Japanese Patent Application Publication No. 2006-128484)

FIG. 8 is a schematic plan view and side view or explaining a component terminal. An example of a component terminal 101 used in the flip-chip system includes a stud bump. The component terminal 101 is arranged on a component electrode 103 of the electronic component. The component electrode 103 is, for example, a pad of a semiconductor chip. The component terminal 101 formed of the stud bump has a tip end formed in a sharp shape due to the formation method.

FIGS. 9A to 9D are view for explaining the process in which the component terminal and the board terminal are bonded.

As shown in FIG. 9A, the component terminal 101 is arranged to direct the tip end to a side of a board terminal 105. The board terminal 105 is provided with an inclined portion 107 on the surface, which is the wider as closer to the base end side toward a peripheral edge. The board terminal 105 is arranged on a board electrode 109. The board electrode 109 is, for example, a lead terminal of a semiconductor package or a connection land of a print board.

The component terminal 101 and the board terminal 105 are arranged to be positioned in center to each other. At this time, there are some cases where a positional deviation occurs between the center of the component terminal 101 and the center of the board terminal 105. This positional deviation is caused by, for example, positioning accuracy between the component terminal 101 and the board terminal 105, positional accuracy of the component terminal 101 on the component electrode 103, positional accuracy of the board terminal 105 on the board electrode 109 or the like. This positional deviation amount is usually the degree of several μm to 10 μm (micrometers).

After the positioning between the component terminal 101 and the board terminal 105 is performed, as shown in FIG. 9B the component terminal 101 relatively approaches the board terminal 105. The tip end of the component terminal 101 makes contact with the inclined portion 107 of the board terminal 105.

As the bonding operation proceeds, the component terminal 101 further relatively approaches the board terminal 105. As shown in FIG. 9C, the tip end portion of the component terminal 101 moves to a peripheral edge side of the board terminal 105 along the inclined portion 107 of the board terminal 105 to increase the positional deviation amount. As the bonding operation further proceeds, the positional deviation amount increases.

At the completion of the bonding operation, as shown in FIG. 9D, the positional deviation amount between the center of the component terminal 101 and the center of the board terminal 105 is several times to several ten times the amount at the time the component terminal and the board terminal are positioned. The positional deviation of the component terminal 101 from the board terminal 105 leads to a positional deviation of the electronic component from a mount position of the electronic component on the mount board.

When a portion of the board terminal 105 with which the component terminal 101 makes contact is flat, this positional deviation is reduced. However, in almost all of a plated layer, a Cu pillar bump, a solder ball and the like representative of the board terminal 105, the portion with which the component terminal 101 makes contact is not formed to be flat, and is more or less inclined. Therefore in fact, there are many cases where the sharp tip end portion of the component terminal 101 is crushed to be flat (leveling) before flip-chip mounting to reduce the causes of the positional deviation, thus improving mounting properties.

FIG. 10 is schematic side views for explaining a flattening process of the tip end portion of the stud bump.

A jig 111 a tip end of which is flat strikes the tip end of the component terminal 101 formed of the stud bump. Thereby the tip end portion of the component terminal 101 is flattened.

However, even in the component terminal 101 having the flat tip end portion, if the portion of the board terminal 105 with which the component terminal 101 makes contact is inclined, the above positional deviation possibly occurs.

In view of the above, there exists a need for a mounting method of an electronic component that overcomes the foregoing problems in the conventional technology. The present invention addresses this need in the conventional technology as well as other needs, which will become apparent from those skilled in the art from this disclosure.

SUMMARY OF THE INVENTION

An object of the present invention is to provide a mounting method of an electronic component, an electronic component mount body and a manufacturing method thereof for, at the time an electronic component is on a mount board by flip-chip bonding, preventing a positional deviation of the electronic component in relation to a mounting position of the electronic component on the mount board.

The object is basically achieved by providing a mounting method of an electronic component in which the electronic component is mounted on a mount board by flip-chip bonding, comprising the steps of providing at least two of component terminals for the electronic component, providing at least two of board terminals for the mount board, and providing an inclined portion on a surface of the board terminal, the inclined portion being the wider as closer to a base end side toward a peripheral edge thereof, wherein in a case where a position of at least one of the component terminals is offset in relation to a position of the corresponding board terminal, and a position of at least one of the component terminals among the other component terminals is offset in the opposite side to the direction of the offset in relation to a position of the corresponding board terminal, the component terminal makes contact with the inclined portion of the board terminal to bond the component terminal and the board terminal.

The mounting method of the electronic component according to the above configuration can prevent the positional deviation of the electronic component in relation to the mount position of the electronic component on the mount board at the time the electronic component is mounted on the mount board by the flip-chip bonding.

These and other objects, features, aspects and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Preferred embodiments of the present invention will be explained hereinafter in detail with reference to the accompanying drawings. It will be apparent to those skilled in the art from this disclosure that the following description of the embodiments of the present invention are provided for illustration only, and not for the purpose of limiting the invention as defined by the appended claims and their equivalents.

Figure 1A:
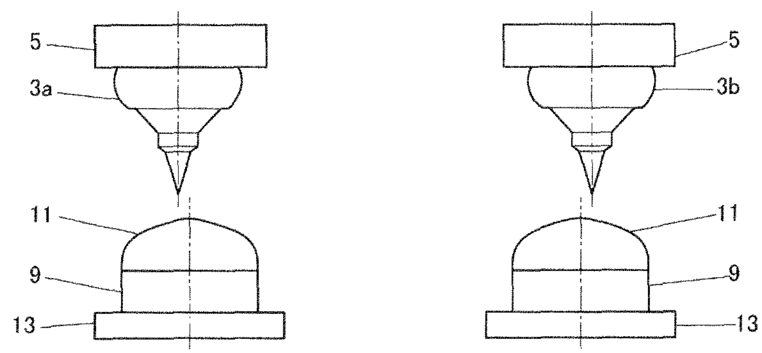
FIGS. 1A, 1B and 1C are schematic cross sections for explaining an arrangement of a component terminal of an electronic component and a board terminal of a mount board.
Figure 1B:
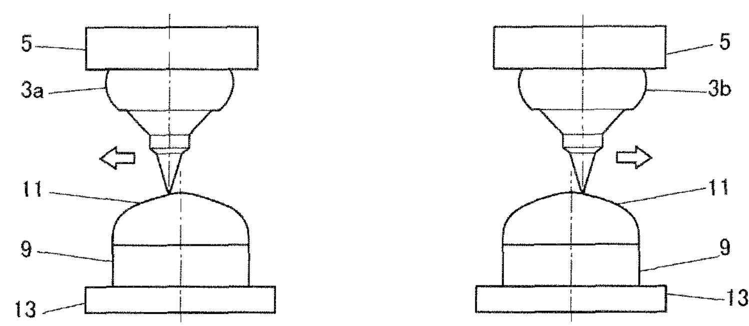
Figure 1C:
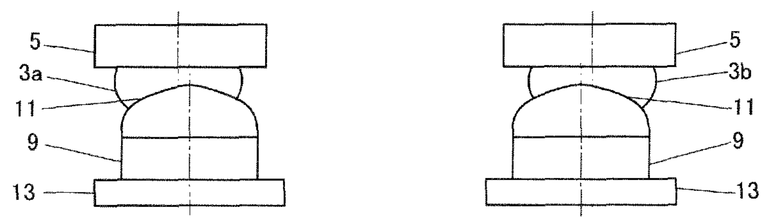
Figure 2:
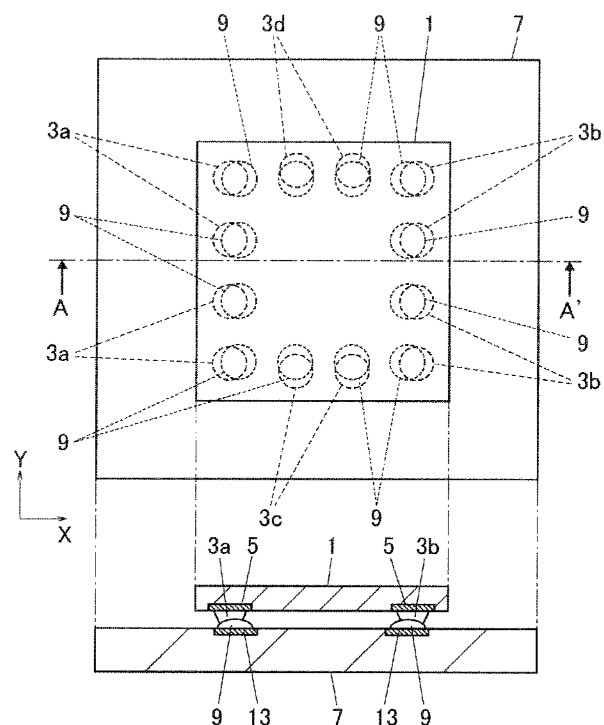
FIG. 2 is schematic plan view and cross section for explaining an electronic component mount body according to an embodiment of the present invention.

Each of FIGS. 1A, 1B and 1C is a schematic cross section for explaining an arrangement of a component terminal of an electronic component and a board terminal of a mount board. FIG. 2 is schematic plan view and cross section for explaining an electronic component mount body according to an embodiment of the present invention. The cross section of each of FIGS. 1A, 1B and 1C corresponds to a position of arrows A-A in FIG. 2. In each of FIGS. 1A, 1B and 1C, only a component terminal and a component electrode of an electronic component, and only a board terminal and a board electrode of a mount board are illustrated.

An embodiment of each of a mounting method of the electronic component and a manufacturing method of the electronic component mount body will be explained. As these embodiments, an explanation will be made of, for example, a case where an IC chip in which a stud bump is arranged as a component terminal is mounted on a mount board a board terminal of which is formed of Cu or the like on a base material such as epoxy glass by flip-chip bonding.

As shown in FIG. 2, for example, an electronic component 1 as an IC chip is provided with a plurality of component terminals 3*a* to 3*d*. The component terminals 3*a* to 3*d* are, for example, Au stud bumps each having a sharp end. The component terminals 3*a* to 3*d* are arranged on a component electrode 5 forming part of a stud.

For example, a mount board 7 as a print board is provided with a plurality of board terminals 9 corresponding to the component terminals 3*a* to 3*d*. The board terminal 9 has a tip end that is a Cu pillar bump in which a solder layer is provided on a tip end of a Cu pillar. The board terminal 9 has a surface provided with an inclined portion 11 that is the wider as closer to a base end side toward the peripheral edge. The board terminal 9 is arranged on a board electrode 13 forming a land.

The component terminals 3*a* to 3*d* and the board terminals 9 are arranged along sides of a rectangle. A position of each of the component terminals 3*a* to 3*d* is offset in relation to a position of the board terminal 9. In the present embodiment, the configuration that the position of the component terminal is offset in relation to the position of the board terminal means the configuration that a central position of the component terminal is arranged to deviate from a central position of the board terminal.

In one set of two opposing sides in four sides of the rectangle, the position of each of the component terminals 3*a* arranged along one side is offset in the same direction in relation to the position of the corresponding board terminal 9. Here, the position of the component terminal 3*a* is offset in a negative direction of X axis on an XY plane.

The position of each of the component terminals 3*b* arranged along the other side is offset in the opposite direction to a direction of the offset of the component terminal 3*a* in relation to the position of the corresponding board terminal 9. Here, the position of the component terminal 3*b* is offset in a positive direction of X axis on the XY plane.

In the other set of two opposing sides in four sides of the rectangle, a position of each of the component terminals 3*c* arranged along one side is offset in the same direction in relation to the position of the corresponding board terminal 9. Here, the position of the component terminal 3*c* is offset in a negative direction of Y axis on the XY plane.

A position of each of the component terminals 3*d* arranged along the other side is offset in the opposite side to the direction of the offset of the component terminal 3*c* in relation to the position of the corresponding board terminal 9. Here, the position of the component terminal 3*d* is offset in a positive direction of Y axis on the XY plane.

It should be noted that the component terminal arranged in each of the four corners in the rectangle is disposed in the component terminal 3*a* or 3*b*, but may be disposed in the component terminals 3*c* or 3*d* to be offset.

At the time of performing the mount operation by the flip-chip bonding, first, as shown in FIG. 1A, the component terminals 3*a* and 3*b* are arranged such that each tip end is directed to a side of the board terminal 9. By referring to FIG. 2, the position of the component terminal 3*a* is offset in the negative direction of X axis in relation to the position of the corresponding board terminal 9. The position of the component terminal 3*b* is offset in the positive direction of X axis in relation to the position of the corresponding board terminal 9. Although not illustrated in FIGS. 1A to 1C, the position of the component terminal 3*c* is offset in the negative direction of Y axis in relation to the position of the corresponding board terminal 9, and the position of the component terminal 3*d* is offset in the positive direction of Y axis in relation to the position of the corresponding board terminal 9. An offset amount of the position of each of the component terminals 3*a* to 3*d* in relation to the position of the board terminal 9 is in a range of, for example, several am to several ten μm.

As shown in FIG. 1B, the component terminals 3*a* and 3*b* relatively approach the board terminals 9. At the same time, the component terminals 3*c* and 3*d* also relatively approach the board terminals 9. The tip end of each of the component terminals 3*a* to 3*d* makes contact with the inclined portion 11 of the corresponding board terminal 9.

When the component terminals 3*a* to 3*d* further relatively approach the board terminals 9, a force (refer to an arrow) in the negative direction of X axis acts on the tip end of the component terminal 3*a* making contact with the inclined portion 11 of the board terminal 9. In addition, a force (refer to an arrow) in the positive direction of X axis acts on the tip end of the component terminal 3*b* making contact with the inclined portion 11 of the board terminal 9. In the electronic component 1, the deviation force in the negative direction and the deviation force in the positive direction are cancelled out to be balanced. Thereby the position of each of the component terminals 3*a* and 3*b* is maintained to the position of the board terminal 9 to prevent the positional deviation of the electronic component 1 in each of the positive and negative directions of X axis.

Similarly, a force in the negative direction of Y axis acts on the tip end of the component terminal 3*c* making contact with the inclined portion 11 of the board terminal 9, and a force in the positive direction of Y axis acts on the tip end of the component terminal 3*d* making contact with the inclined portion 11 of the board terminal 9. Thereby in the electronic component 1, the deviation force in the negative direction and the deviation force in the positive direction of Y axis act to be balanced and to maintain the position of each of the component terminals 3*c* and 3*d*, thus preventing the positional deviation of the electronic component 1 in each of the positive and negative directions of Y axis.

When energy necessary for the bonding, such as loads or vibrations is relatively applied to the electronic component 1 and the mount board 7 in the state offset in this manner, the component terminals 3*a* to 3*d*, and the corresponding hoard terminals 9 are respectively bonded (refer to FIG. 1C and FIG. 2). In the electronic component mount body in which the electronic component 1 is mounted on the mount board 7, the component terminals 3*a* to 3*d* are respectively offset in relation to the positions of the corresponding board terminals 9.

In this manner, at the time the electronic component 1 is mounted on the mount board 7 by the flip-chip bonding, the positional deviation of the electronic component 1 in relation to the mounting position of the electronic component on the mount board 7 is prevented.

In addition, when the offsets in the positive and negative directions of X axis (two directions) are defined as an X axis offset group and the offsets in the positive and negative directions of Y axis (two directions) are defined as a Y axis offset group, two or more offset groups the offset directions of which are different from each other are provided in the present embodiment. The direction of the offset in the X axis offset group is perpendicular to that in the Y axis offset group. Providing two offset groups the offset directions of which are perpendicular to each other in this manner prevents the positional deviation of the electronic component 1 in relation to the mount position of the electronic component on the mount board 7 in any direction.

Next, an example of a method for offsetting a position of a component terminal in relation to a position of a board terminal is explained.

Figure 3:
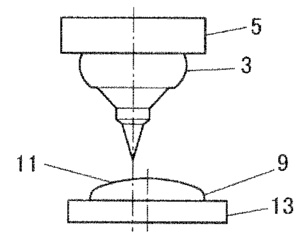
FIG. 3 is a schematic cross section for explaining the arrangement of the component terminal of the electronic component and the board terminal of the mount board.
Figure 4:
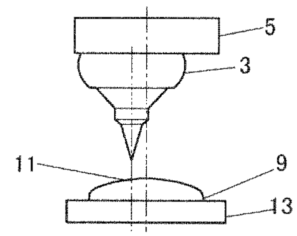
FIG. 4 is a schematic cross section for explaining the arrangement of the component terminal of the electronic component and the board terminal of the mount board.

FIG. 3 and FIG. 4 are schematic cross sections for explaining an arrangement of a component terminal of an electronic component and a board terminal of a mount board.

As shown in FIG. 3, the offset of the position of the component terminal 3 in relation to the position of the board terminal 9 is realized, for example, by offsetting the position of the component electrode 5 in the electronic component in relation to the position of the board electrode 13 of the mount board in advance at a point of designing. Hereinafter, this design method is called an offset arrangement design.

In addition, in the flip-chip mount, the position of the component electrode 5 in the electronic component and the position of the board electrode 13 on the mount board are set to the same position on the design. That is, a center coordinate of the component electrode 5 and a center coordinate of the corresponding board electrode 13 are set to the same position.

Therefore, for example, as shown in FIG. 4, by adjusting the position of the component terminal 3 inside the component electrode 5, the position of the component terminal 3 may be offset in relation to the position of the board terminal 9. It should be noted that by adjusting the position of the board terminal 9 inside the board electrode 13, or by combining this configuration and the configuration shown in FIG. 4, the position of the component terminal 3 in relation to the position of the board terminal 9 may be offset. Hereinafter, this design method is called the same position design.

With the offset arrangement design (FIG. 3), at least one of the component electrode 5 and the board electrode 13 can be downsized more than in the same position design (FIG. 4).

In addition, the same position design, also in a case where the offset arrangement can be made only by an amount short of the estimated amount due to constraint of the design rule or the like, can realize the above offset by adjusting at least one of the position of the component terminal 3 inside the component electrode 5 and the position of the board terminal 9 inside the board electrode 13. Further, the same position design, also in a case where the position design to each of the component electrode 5 and the board electrode 13 is already completed, can realize the above offset without redesigning the position design.

It should be noted that in view of the constraint of the design rule or costs, the above offset may be realized by combining the offset arrangement design and the same position design.

Next, an example of a component terminal and a board terminal is explained.

Figure 5:
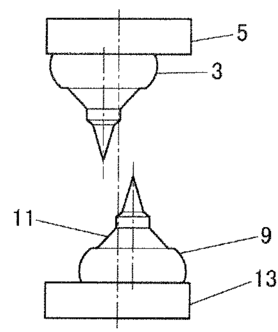
FIG. 5 is a schematic cross section for explaining the arrangement of the component terminal of the electronic component and the board terminal of the mount board.
Figure 6:
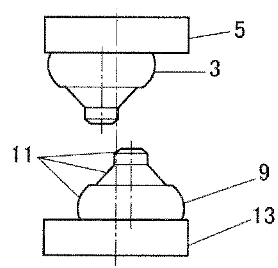
FIG. 6 is a schematic cross section for explaining the arrangement of the component terminal of the electronic component and the board terminal of the mount board.

FIG. 5 and FIG. 6 are schematic cross sections for explaining an arrangement of a component terminal of an electronic component and a board terminal of a mount board.

As shown in FIG. 5, the component terminal 3 and the board terminal 9 both are stud bumps. The position of the component terminal 3 is offset from the position of the board terminal 9 in such a manner that the component terminal 3 makes contact with the inclined portion 11 of the board terminal 9 at the flip-chip bonding.

In a case where the component terminal 3 and the board terminal 9 both are stud bumps each having a sharp end, the positional deviation factor increases due to the sharp end shape. Therefore in the conventional technology, the flattening processing (leveling) of the tip end portion is necessary in regard to one or both of the stud bumps forming the component terminal 3 and the board terminal 9.

On the other hand, in this embodiment, the position of the component terminal 3 is offset from the position of the board terminal 9 on purpose in such a manner that the component terminal 3 makes contact with the inclined portion 11 of the board terminal 9 at the flip-chip bonding. Therefore according to this embodiment, the flattening processing of the tip end portion is not necessary in regard to each of the stud bumps forming the component terminal 3 and the board terminal 9, thus obtaining a substantial process eliminating effect.

Particularly when a size of the electronic component is large to increase the pin number of the component terminals 3, there occurs a problem with the leveling implementation. In a case of leveling a plurality of stud bumps all together, leveling finish accuracy is degraded. In a case of leveling the stud bumps one by one, working hours extend corresponding to the pin number.

In this embodiment, it is not necessary to level the stud bump. Therefore these problems can be simultaneously solved to lower the hurdle for adoption of the flip-chip system to the stud bumps each other, thus increasing selections in regard to the mount method.

In addition, as shown in FIG. 6, the component terminal 3 and the board terminal 9 both may be stud bumps each having a flat tip end portion. The position of the component terminal 3 is offset from the position of the board terminal 9 in such a manner that the component terminal 3 makes contact with inclined portions 11 of the board terminal 9 at the flip-chip bonding.

The stud bump is provided with the inclined portion 11 due to a chamfered portion formed in a hollow needle used for formation of the stud bump. By actively using the inclined portion 11 of the board terminal 9 formed of the stud bump having the flat tip end portion, the above offset is formed in such a manner that the component terminal 3 makes contact with the inclined portion 11 of the board terminal 9 at the flip-chip bonding. Thereby the positional deviation restricting effect can be improved.

Next, an arrangement of a plurality of offsets is explained.

Figure 7:
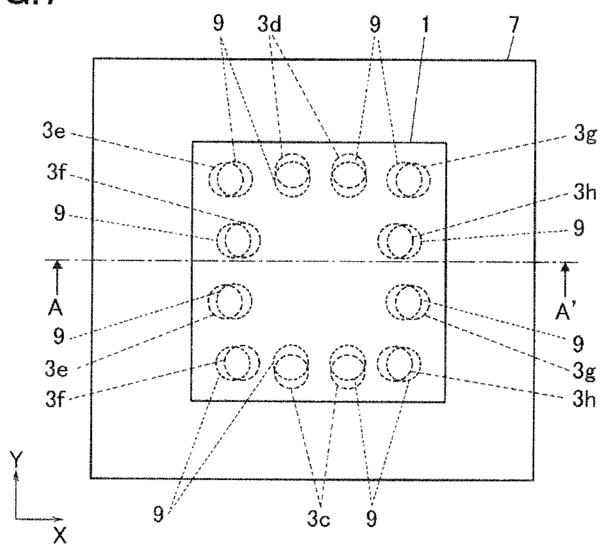
FIG. 7 is a schematic plan view for explaining an electronic component mount body according to a different embodiment of the present invention.
Figure 8:
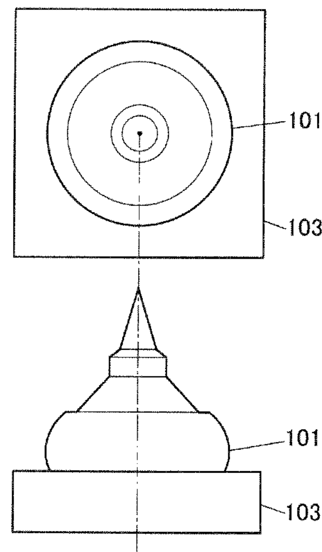
FIG. 8 is schematic plan view and cross section for explaining a component terminal.
Figure 9A:
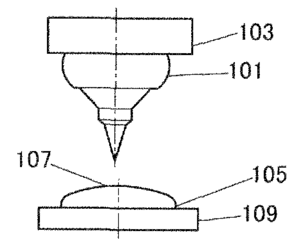
FIGS. 9A, 9B, 9C and 9D are schematic side views for explaining the process in which the component terminal and the board terminal are bonded.
Figure 9B:
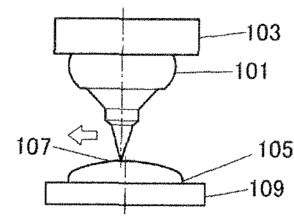
Figure 9C:
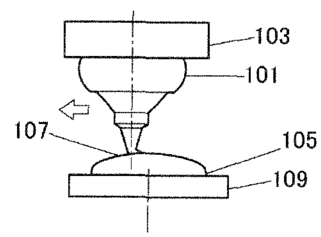
Figure 9D:
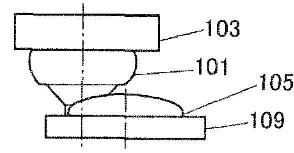
Figure 10:
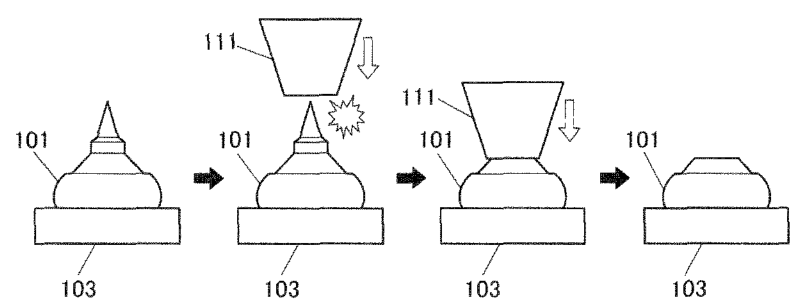
FIG. 10 is a schematic side view for explaining the process of flattening a tip end portion of a stud bump.

FIG. 7 is a schematic plan view for explaining the other embodiment of an electronic component mount body. Components identical to those in FIG. 2 are referred to as identical codes, and the explanation of these parts is omitted.

In FIG. 7, component terminals **3*e* and 3*f* are arranged along one side of a rectangle. The position of the component terminal 3*e* is offset in the negative direction of X axis in relation to the position of the corresponding board terminal 9. The position of the component terminal 3*f* is offset in the positive direction of X axis in relation to the corresponding board terminal 9**.

Component terminals **3*g* and 3*h* are arranged along the opposing side to the side along which the component terminals 3*e* and 3*f* are arranged. The position of the component terminal 3*g* is offset in the positive direction of X axis in relation to the position of the corresponding board terminal 9. The position of the component terminal 3*h* is offset in the negative direction of X axis in relation to the corresponding board terminal 9**.

At flip-chip bonding, the force in the negative direction of X axis acts on the component terminals **3*e* and 3*h* and the force in the positive direction of X axis acts on the component terminals 3*f* and 3*g***, and these forces are cancelled out to prevent the positioning deviation of the mount position of the electronic component. In this manner, the offset may be set to the component terminal and the board terminal arranged along one side As described above, the embodiments of the present invention are explained, but the numerical values, the materials, the arrangements, the piece numbers and the like in the above embodiments are shown just as examples, and the present invention is not limited thereto, and various modifications thereof are possible within the scope of the present invention defined in claims.

Before the flip-chip bonding, the positioning between the component terminal and the board terminal is usually performed, but there are many factors affecting the positioning accuracy. Examples of the factor affecting the positioning accuracy include mechanical resolution performance of the equipment, image recognition accuracy, position accuracy of the component terminal, board terminal forming accuracy, dimension accuracy of the electronic component and the mount board including heat contraction, and the like.

Accordingly, by adjusting the offset amount of the position of the component terminal in relation to the corresponding board terminal, the variation factor of the above position accuracy can be absorbed to prevent generation of the positional deviation of the electronic component in relation to the mount position of the electronic component on the mount board.

That is, generation of the positional deviation of the electronic component is difficult to depend on the mechanical variation, the bonding parameter and the material of the equipment or like at bonding. According, the setting of the bonding condition can be facilitated and the variation of the bonding condition at production can be restricted to make it easy to maintain the stable bonding.

In addition, with the embodiments of the present invention, it is possible to provide the product without the positional deviation, which so far has had the difficulty of performing the flip-chip mount due to the constraint such as the number (pin number) of the component terminal or the size of the electronic component. For example, in a case of the flip-chip bonding of the electronic component that has pins as many as to exceed 300 pins and one side of which is as large as to exceed 10 mm, it is necessary to apply strong vibration or high pressures. The strong vibration or the high pressure becomes a great cause of the bond positional deviation. Even if the positional deviation in the mount position of the electronic component is extremely small, it possibly leads to a serious short circuit to the neighboring terminal. The present invention that restricts the positional deviation in the mount position of the electronic component enables the flip-chip mount of the electronic component having many pins or the large-sized electronic component that so far has been difficult to restrict the positional deviation.

In the mount method of the electronic component, the electronic component mount body, and the manufacturing method thereof of the present invention, the surface shape of the inclined portion of the board terminal is not limited to the above embodiments. For example, on the cross section passing through the center axis of the board terminal, the inclined portion may be a linear shape or a curved shape. In addition, the inclined portion, for example, as shown in FIG. 6, may comprise a plurality of inclined portions that are arranged disconnectedly. In addition, the inclined portion includes a shape that is substantially the wider as closer to the base end side toward the peripheral edge by a plurality of steps formed by a vertical plane in parallel with the center axis and a horizontal plane perpendicular thereto.

In the mount method of the electronic component, the electronic component mount body, and the manufacturing method thereof of the present invention, an example of the component terminal includes the stud bump. The stud bump may be provided with the sharp end, and the tip end portion may be flattened. It should be noted that the component terminal is not limited to the stud bump. The component terminal may include an element having such a shape as to be able to make contact with the inclined portion of the board terminal at flip-chip bonding. For example, the component terminal may include a Cu pillar bump, a solder hump, a plated layer or the like.

In the mount method of the electronic component, the electronic component mount body, and the manufacturing method thereof of the present invention, an example of the board terminal includes the stud bump. The stud bump may be provided with the sharp end, and the tip end portion may be flattened. It should be noted that the board terminal is not limited to the stud bump. The board terminal may include thereon an element having the inclined portion that is the wider as closer to the base end side toward the peripheral edge at a position of making contact with the component terminal. For example, the board terminal may include a Cu pillar bump, a solder bump, a plated layer or the like.

In the mount method of the electronic component, the electronic component mount body, and the manufacturing method thereof of the present invention, the offsets in the two directions are defined as an offset group, and two or more of the offset groups the offset directions of which are different from each other may be provided. When two or more of the offset groups the offset directions of which are different from each other are provided, it is possible to prevent the deviation in the mount position of the electronic component in the plural directions. However, even in a case where the offset group is only one group, since it is possible to prevent the deviation in the mount position of the electronic component in the offset direction in the offset group, the effect of the present invention can be obtained. The number of the offset groups the offset directions of which are different from each other is not particularly limited.

Further, when two or more of the offset groups include the two offset groups the offset directions of which are perpendicular to each other, it is possible to prevent the deviation in the mount position of the electronic component more certainly. However, two or more of the offset groups may not include the offset groups the offset directions of which are perpendicular to each other.

In the above embodiment, for example, as shown in FIG. 2, the two offset groups the offset directions of which are perpendicular to each other are set, but the offset group to be set may include three or more groups. For example, in FIG. 2, an offset group having the offsets in directions inclined to X axis and Y axis may be set to the component terminal and the board terminal respectively arranged in the opposing corners of the rectangle.

There can be provided an example in which in the mount method of the electronic component, the electronic component mount body, and the manufacturing method thereof according to the present invention, the component terminal and the board terminal are arranged along the side of the rectangle. An example of the arrangement in the offset direction in this case is explained. The offset in the same direction is set to the component terminal and the board terminal along one side among one set of two opposing sides in the sides of the rectangle. Further, the offset in the opposite side to the direction of the offset in the one side is set to the component terminal and the board terminal arranged along the other side. As a result, the present invention can be applied to an electronic component having a general arrangement of component terminals in a semiconductor such as an IC chip. However, the arrangement of the offset in the present invention is not limited thereto in the configuration in which component terminals and board terminals are arranged along sides of a rectangle.

In the mount method of the electronic component, the electronic component mount body, and the manufacturing method thereof of the present invention, the offset may be set to the component terminal and the board terminal along at least one side among the sides in the rectangle. This configuration can prevent the deviation in the mount position of the electronic component in the side of the rectangle. It should be noted that two or more of the offset groups the offset directions of which are different from each other may be provided in the side of the rectangle.

There can be provided an example in which in the mount method of the electronic component, the electronic component mount body, and the manufacturing method thereof according to the present invention, the electronic component is provided with a component electrode for mounting the component terminal, and the mount board is provided with a board electrode for mounting the board terminal. In this case, an example of the offset can be realized by offsetting the position of the component electrode from the position of the corresponding board electrode. The other example of the offset can be realized by adjusting the position of the component terminal inside the component electrode. The further other example of the offset can be realized by adjusting the position of the board terminal inside the board electrode. The offset may be realized by a combination of them.

The electronic component mount body according to the present invention comprises an electronic component mount body in which the electronic component is mounted on the mount board by the mount method of the electronic component of the present invention. In the electronic component mount body according to the present invention, one or more of the component terminals are offset from the corresponding board terminals to be bonded thereto. Further, one or more of the component terminals among the other component terminals are offset in the opposite side to the direction of the offset from the corresponding board terminals to be bonded thereto. In the electronic component mount body according to the present invention, the positional deviation of the electronic component in relation to the mount position of the electronic component on the mount board can be prevented by the effect of the mounting method of the electronic component according to the present invention.

The manufacturing method of the electronic component mount body according to the present invention comprises a manufacturing method of an electronic component mount body in which an electronic component is mounted on a mount board by flip-chip bonding, wherein the electronic component is mounted on the mount board by the mounting method of the electronic component according to the present invention. The manufacturing method of the electronic component mount body according to the present invention can prevent the positional deviation of the electrode component in relation to the mount position of the electronic component on the mount board by the effect of the mounting method of the electronic component according to the present invention.

An example of the design method of the electronic component mount body sets the offset to the position of the component terminal and the position of the board terminal for realizing the mounting method of the electronic component according to the present invention. This design method can realize the mounting method of the electronic component according to the present invention that prevents the positional deviation of the electronic component in relation to the mount position of the electronic component on the mount board.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention is provided for illustration only, and not for the purpose of limiting the invention as defined by the appended claims and their equivalents.

What is claimed is:

1. A mounting method of an electronic component in which the electronic component is mounted on a mount board by flip-chip bonding, comprising the steps of:
- providing at least two of component terminals for the electronic component;
- providing at least two of board terminals for the mount board; and
- providing an inclined portion on a surface of the board terminal, the inclined portion being wider as closer to a base end side toward a peripheral edge thereof, wherein
- in a case where a position of at least one of the component terminals is offset along the inclined portion in relation to a position of the corresponding board terminal, and a position of at least one of the component terminals among the other component terminals is offset along the inclined portion in the opposite side to the direction of the offset in relation to a position of the corresponding board terminal, the component terminal makes contact with the inclined portion of the board terminal to bond the component terminal and the board terminal.

2. A mounting method of an electronic component according to claim 1, wherein the component terminal includes a stud bump.

3. A mounting method of an electronic component according to claim 1, wherein the board terminal includes a stud bump.

4. A mounting method of an electronic component according to claim 1, wherein the stud bump includes a flattened tip end portion.

5. A mounting method of an electronic component according to claim 1, wherein
- the offsets in two directions are defined as an offset group,
- at least two of the offset groups offset directions of which are different to each other are provided, and
- at least two of the offset groups include the two offset groups the offset directions of which are perpendicular to each other.

6. A mounting method of an electronic component according to claim 1, wherein
- the component terminal and the board terminal are arranged along a side of a rectangular board,
- the offset in the same direction is set to the component terminal and the board terminal arranged along one side among one set of two opposing sides in sides of the rectangular board, and
- the offset is set in the opposite side to the offset direction in the one side to the component terminal and the board terminal arranged along the other side.

7. A mounting method of an electronic component according to claim 1, wherein
- the component terminal and the board terminal are arranged along a side of a rectangular board, and
- the offset is set to the component terminal and the board terminal arranged along at least one of sides of the rectangular board.

8. A mounting method of an electronic component according to claim 1, further comprising the steps of:
- providing a component electrode for the electronic component for mounting the component terminal; and
- providing a board electrode for the mount board for mounting the board terminal, wherein
- the offset is realized by offsetting a position of the component electrode from a position of the corresponding board electrode, by at least one of (i) adjusting the position of the component terminal inside the component electrode, (ii) adjusting a position of the board terminal inside the board electrode, or (iii) a combination of the above,
- wherein the component terminal and the board terminal are arranged on the component electrode and the board electrode, respectively.

9. An electronic component mount body in which the electronic component is mounted on the mount board by performing a mounting method comprising the steps of:
- providing at least two of component terminals for the electronic component;
- providing at least two of board terminals for the mount board; and
- providing an inclined portion on a surface of the board terminal, the inclined portion being wider as closer to a base end side toward a peripheral edge thereof, wherein
- in a case where a position of at least one of the component terminals is offset along the inclined portion in relation to a position of the corresponding board terminal, and a position of at least one of the component terminals among the other component terminals is offset along the inclined portion in the opposite side to the direction of the offset in relation to a position of the corresponding board terminal, the component terminal makes contact with the inclined portion of the board terminal to bond the component terminal and the board terminal, and wherein at least one of the component terminals is offset in relation to the corresponding board terminal to be bonded thereto, and at least one of the component terminals among the other component terminals is offset in the opposite side to the direction of the offset in relation to the corresponding board terminal to be bonded thereto.

10. A manufacturing method of an electronic component mount body in which an electronic component is mounted on a mount board by flip-chip bonding, including mounting the electronic component on the mount board by performing a mounting method comprising:

providing at least two of component terminals for the electronic component;

providing at least two of board terminals for the mount board; and providing an inclined portion on a surface of the board terminal, the inclined portion being wider as closer to a base end side toward a peripheral edge thereof, wherein in a case where a position of at least one of the component terminals is offset along the inclined portion in relation to a position of the corresponding board terminal, and a position of at least one of the component terminals among the other component terminals is offset along the inclined portion in the opposite side to the direction of the offset in relation to a position of the corresponding board terminal, the component terminal makes contact with the inclined portion of the board terminal to bond the component terminal and the board terminal.

* * * * *